(12) United States Patent
Honda

(10) Patent No.: US 11,948,804 B2
(45) Date of Patent: Apr. 2, 2024

(54) SUBSTRATE PROCESSING METHOD AND SUBSTRATE PROCESSING APPARATUS

(71) Applicant: Tokyo Electron Limited, Tokyo (JP)

(72) Inventor: Takumi Honda, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 38 days.

(21) Appl. No.: 17/652,320

(22) Filed: Feb. 24, 2022

(65) Prior Publication Data

US 2022/0285166 A1 Sep. 8, 2022

(30) Foreign Application Priority Data

Mar. 2, 2021 (JP) .................................. 2021-032914

(51) Int. Cl.
| | |
|---|---|
| *H01L 21/311* | (2006.01) |
| *C09K 13/04* | (2006.01) |
| *H01L 21/02* | (2006.01) |
| *H01L 21/306* | (2006.01) |
| *H01L 21/67* | (2006.01) |

(52) U.S. Cl.
CPC ........ *H01L 21/31111* (2013.01); *C09K 13/04* (2013.01); *H01L 21/02164* (2013.01); *H01L 21/0217* (2013.01); *H01L 21/022* (2013.01); *H01L 21/30604* (2013.01); *H01L 21/67075* (2013.01); *H01L 21/67086* (2013.01); *H01L 21/67173* (2013.01); *H01L 21/67253* (2013.01)

(58) Field of Classification Search
None
See application file for complete search history.

(56) References Cited

U.S. PATENT DOCUMENTS

| | | | |
|---|---|---|---|
| 2019/0096711 A1* | 3/2019 | Ohno | H01L 21/67017 |
| 2019/0103294 A1* | 4/2019 | Masutomi | H01L 21/67086 |
| 2019/0237338 A1* | 8/2019 | Rotondaro | C09K 13/08 |

FOREIGN PATENT DOCUMENTS

JP 2019-067810 A 4/2019

* cited by examiner

*Primary Examiner* — Jiong-Ping Lu
(74) *Attorney, Agent, or Firm* — Pearne & Gordon LLP

(57) ABSTRACT

A substrate processing method includes preparing a phosphoric acid processing liquid, etching a substrate and increasing a concentration of the precipitation inhibitor. The phosphoric acid processing liquid is prepared by supplying a precipitation inhibitor into a phosphoric acid aqueous solution. The substrate having a silicon oxide film and a silicon nitride film is etched by immersing the substrate in a processing tub. The concentration of the precipitation inhibitor is increased by additionally supplying the precipitation inhibitor into the phosphoric acid processing liquid when a number of substrates etched has reached a first threshold value or when a silicon concentration in the phosphoric acid processing liquid has reached a second threshold value. The etching of the substrate comprises etching a new substrate by immersing the new substrate in the processing tub in which the phosphoric acid processing liquid with the increased concentration of the precipitation inhibitor is stored.

13 Claims, 6 Drawing Sheets

*FIG. 6*

| NUMBER OF ADDITIONAL SUPPLIES OF PRECIPITATION INHIBITOR | FIRST THRESHOLD VALUE |
|---|---|
| 0 | 50 SHEETS |
| 1 | 60 SHEETS |
| 2 | 70 SHEETS |
| ⋮ | ⋮ |

SUBSTRATE PROCESSING METHOD AND SUBSTRATE PROCESSING APPARATUS

CROSS-REFERENCE TO RELATED APPLICATION

This application claims the benefit of Japanese Patent Application No. 2021-032914 filed on Mar. 2, 2021, the entire disclosure of which is incorporated herein by reference.

TECHNICAL FIELD

The various aspects and embodiments described herein pertain generally to a substrate processing method and a substrate processing apparatus.

BACKGROUND

Conventionally, there is known a technique of etching a substrate by immersing the substrate in a phosphoric acid aqueous solution containing a precipitation inhibitor that inhibits precipitation of silicon oxide ($SiO_2$) (see Patent Document 1).

Patent Document 1: Japanese Patent Laid-open Publication No. 2019-067810

SUMMARY

In one exemplary embodiment, a substrate processing method includes preparing a phosphoric acid processing liquid, etching a substrate and increasing a concentration of the precipitation inhibitor. In the preparing of the phosphoric acid processing liquid, the phosphoric acid processing liquid is prepared by supplying a precipitation inhibitor configured to inhibit precipitation of silicon oxide into a phosphoric acid aqueous solution. In the etching of the substrate, the substrate having a silicon oxide film and a silicon nitride film is etched by immersing the substrate in a processing tub in which the phosphoric acid processing liquid is stored. In the increasing of the concentration of the precipitation inhibitor, the concentration of the precipitation inhibitor in the phosphoric acid processing liquid is increased by additionally supplying the precipitation inhibitor into the phosphoric acid processing liquid in the processing tub when a number of substrates etched by the phosphoric acid processing liquid has reached a first threshold value or when a silicon concentration in the phosphoric acid processing liquid has reached a second threshold value. The etching of the substrate comprises, after the increasing of the concentration of the precipitation inhibitor, etching a new substrate by immersing the new substrate in the processing tub in which the phosphoric acid processing liquid with the increased concentration of the precipitation inhibitor is stored.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 6 is a diagram illustrating an example of first threshold information; and

DETAILED DESCRIPTION

Figure 1:
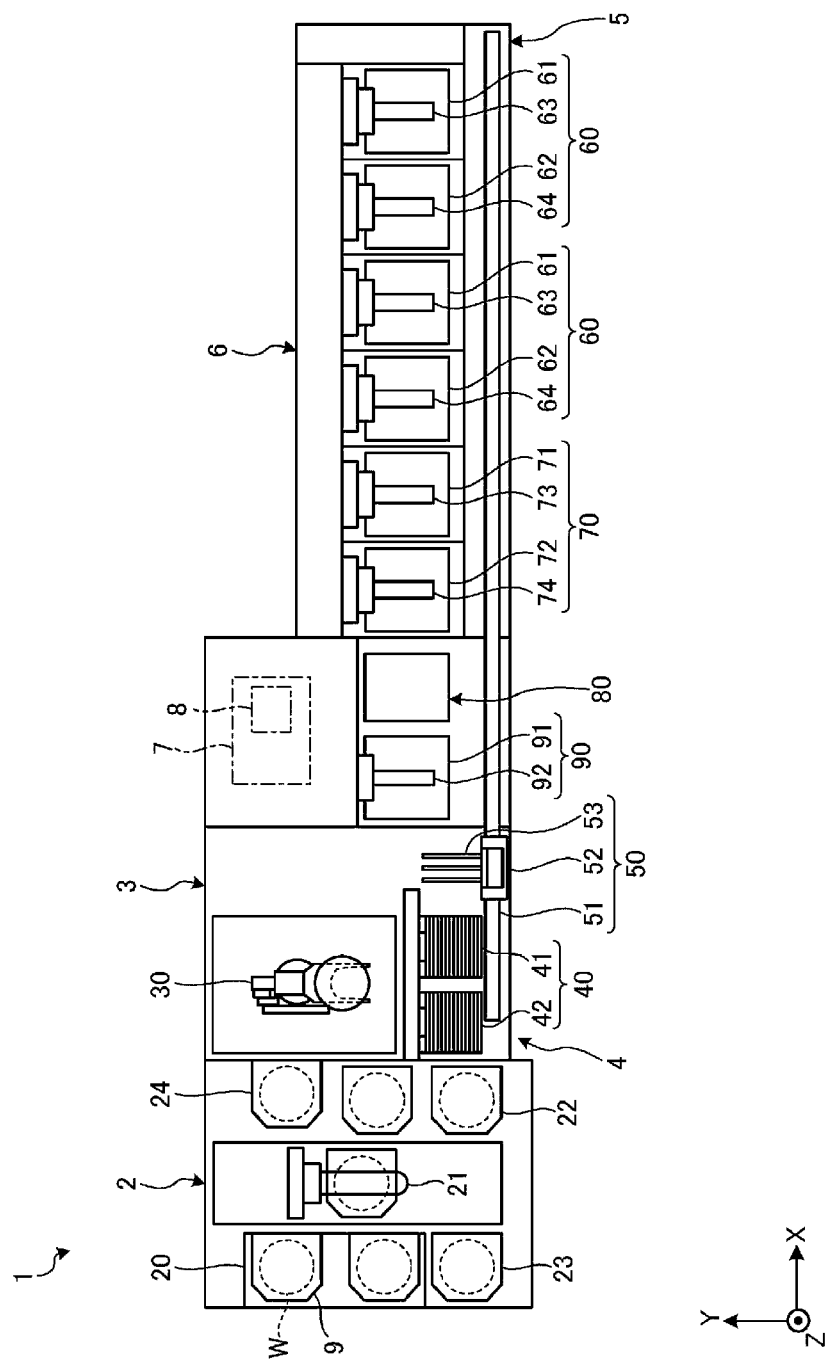
FIG. 1 is a schematic diagram illustrating a configuration of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing apparatus according to the present disclosure will be described in detail with reference to the accompanying drawings. The present disclosure is not limited to the exemplary embodiments to be described below. Further, it should be noted that the drawings are schematic and relations in sizes of individual components and ratios of the individual components may sometimes be different from actual values. Even between the drawings, there may exist parts having different dimensional relationships or different ratios.

Conventionally, there is known a technique of immersing, in a phosphoric acid aqueous solution ($H_3PO_4$), a substrate having a pattern in which a silicon oxide film ($SiO_2$) and a silicon nitride film (SiN) are alternately stacked, to thereby etch the silicon nitride film selectively between the silicon oxide film and the silicon nitride film.

If the substrate is immersed in the phosphoric acid aqueous solution, silicon is eluted from the substrate, so that a silicon concentration in the phosphoric acid aqueous solution increases. If the silicon concentration in the phosphoric acid aqueous solution rises, there is a likelihood that the silicon oxide ($SiO_2$) may be precipitated on the silicon oxide film of the substrate. As a resolution, there is known a technique of performing etching of the substrate by using a phosphoric acid aqueous solution to which a precipitation inhibitor configured to inhibit precipitation of the silicon oxide (hereinafter, simply referred to as "precipitation inhibitor") is added.

Conventionally, the phosphoric acid aqueous solution including the precipitation inhibitor has been discarded after being used for a single etching process. To reduce running cost, however, there is a demand for a technique enabling to improve efficiency of using the phosphoric acid aqueous solution.

Here, selectivity between the silicon oxide film and the silicon nitride film varies depending on the silicon concentration in the phosphoric acid aqueous solution. Further, the "selectivity" in the processing by the phosphoric acid aqueous solution refers to a ratio of an etching rate of the silicon nitride film to an etching rate of the silicon oxide film. As stated above, the silicon concentration in the phosphoric acid aqueous solution changes as an etching process progresses. Thus, if the phosphoric acid aqueous solution is reused in multiple etching processes, there is a risk that the selectivity may not be uniform for the etching processes. In this regard, it is difficult to perform the etching processes stably by simply reusing the phosphoric acid aqueous solution.

It is known that the selectivity of the silicon nitride film with respect to the silicon oxide film increases as the silicon concentration in the phosphoric acid aqueous solution increases. In other words, the etching rate of the silicon oxide film decreases with an increase of the silicon concentration in the phosphoric acid aqueous solution. The inventor of the present application has conducted intensive research and found out that the etching rate of the silicon oxide film is raised by increasing the amount of the precipitation inhibitor even if the silicon concentration is maintained constant. That is, it was found that the selectivity of the silicon nitride film with respect to the silicon oxide film can be adjusted by increasing the amount of the precipitation inhibitor.

Based on this result, in a substrate processing method according to the present disclosure, a phosphoric acid aqueous solution containing a precipitation inhibitor (hereinafter, also referred to as 'phosphoric acid processing liquid') is used for multiple etching processes while additionally adding the precipitation inhibitor thereto appropriately. Accordingly, it is possible to realize efficient use of the phosphoric acid processing liquid (phosphoric acid aqueous solution) while suppressing non-uniformity of the selectivity between the silicon oxide film and the silicon nitride film.

<Configuration of Substrate Processing System>

First, a configuration of a substrate processing system 1 according to an exemplary embodiment will be described with reference to FIG. 1. FIG. 1 is a schematic diagram illustrating the configuration of the substrate processing system 1 according to the exemplary embodiment. The substrate processing system 1 is an example of a substrate processing apparatus.

As depicted in FIG. 1, the substrate processing system 1 according to the exemplary embodiment is equipped with a carrier carry-in/out unit 2, a lot forming unit 3, a lot placing unit 4, a lot transferring unit 5, a lot processing unit 6, and a controller 7.

The carrier carry-in/out unit 2 is equipped with a carrier stage 20, a carrier transfer device 21, carrier stocks 22 and 23, and a carrier placing table 24.

The carrier stage 20 places thereon a plurality of carriers 9 transferred from the outside. Each of the carriers 9 is a container configured to accommodate therein a plurality (e.g., twenty five sheets) of wafers W while allowing the wafers W to be vertically arranged in a horizontal posture. The carrier transfer device 21 transfers the carriers 9 between the carrier stage 20, the carrier stocks 22 and 23, and the carrier placing table 24.

A plurality of wafers W before being processed is carried out from the carrier 9 placed on the carrier placing table 24 into the lot processing unit 6 by a substrate transfer device 30 to be described later. Further, a plurality of wafers W after being processed is carried into the carrier 9 placed on the carrier placing table 24 from the lot processing unit 6 by the substrate transfer device 30.

The lot forming unit 3 is equipped with the substrate transfer device 30 to form a lot. The lot is composed of a plurality (e.g., fifty sheets) of wafers W to be processed simultaneously by combining the wafers W accommodated in one or more carriers 9. The wafers W belonging to the single lot are arranged with their plate surfaces facing each other at a regular distance therebetween.

The substrate transfer device 30 transfers the wafers W between the carrier 9 placed on the carrier placing table 24 and the lot placing unit 4.

The lot placing unit 4 is equipped with a lot transfer table 40 to temporarily place (stand by) thereon the lot which is transferred between the lot forming unit 3 and the lot processing unit 6 by the lot transferring unit 5. The lot transfer table 40 is equipped with a carry-in placing table 41 on which the lot formed by the lot forming unit 3 and yet to be processed is placed; and a carry-out placing table 42 on which the lot after being processed by the lot processing unit 6 is placed. On the carry-in placing table 41 and the carry-out placing table 42, the wafers W belonging to the single lot are arranged side by side in an upright posture.

The lot transferring unit 5 is equipped with a lot transfer device 50, and configured to transfer the lot between the lot placing unit 4 and the lot processing unit 6 or within the lot processing unit 6. The lot transfer device 50 is equipped with a rail 51, a moving body 52, and a substrate holding body 53.

The rail 51 is disposed along the lot placing unit 4 and the lot processing unit 6 in the X-axis direction. The moving body 52 is configured to be movable along the rail 51 while holding the wafers W. The substrate holding body 53 is provided on the moving body 52 to hold the wafers W arranged side by side in the upright posture.

The lot processing unit 6 is configured to perform an etching processing, a cleaning processing or a drying processing on the plurality of wafers W belonging to the single lot all at once. In the lot processing unit 6, two etching apparatuses 60, a cleaning apparatus 70, a cleaning apparatus 80, and a drying apparatus 90 are arranged along the rail 51.

Each etching apparatus 60 is configured to perform an etching processing on the plurality of wafers W belonging to the single lot all at once. The cleaning apparatus 70 is configured to perform a cleaning processing on the plurality of wafers W belonging to the single lot all at once. The cleaning apparatus 80 is configured to perform a cleaning processing on the substrate holding body 53. The drying apparatus 90 is configured to perform a drying processing on the plurality of wafers W belonging to the single lot all at once. Here, the number of the etching apparatuses 60, the number of the cleaning apparatus 70, the number of the cleaning apparatus 80, and the number of the drying apparatus 90 are not limited to the example shown in FIG. 1.

The etching apparatus 60 is equipped with a processing tub 61 for etching, a processing tub 62 for rinsing, and substrate elevating devices 63 and 64.

The processing tub 61 is capable of accommodating therein the plurality of wafers W of the single lot arranged in the vertical posture. Further, a chemical liquid for etching, specifically, the aforementioned phosphoric acid processing liquid is stored in the processing tub 61. Details of the processing tub 61 will be elaborated later.

The processing tub 62 stores therein a processing liquid for rinsing (for example, deionized water). Each of the substrate elevating devices 63 and 64 is configured to hold the plurality of wafers W of the single lot while allowing the wafers W to be arranged side by side in the upright posture.

The etching apparatus 60 holds, with the substrate elevating device 63, the lot transferred by the lot transferring unit 5, and performs the etching processing by immersing the lot in the phosphoric acid processing liquid of the processing tub 61. The etching processing is performed for, for example, about 1 hour to 3 hours.

The lot after being subjected to the etching processing in the processing tub 61 is transferred to the processing tub 62 by the lot transferring unit 5. The etching apparatus 60 holds the transferred lot with the substrate elevating device 64, and performs the rinsing processing by immersing the lot in the rinse liquid of the processing tub 62. The lot after being subjected to the rinsing processing in the processing tub 62 is then transferred to a processing tub 71 of the cleaning apparatus 70 by the lot transferring unit 5.

The cleaning apparatus 70 is equipped with the processing tub 71 for cleaning, a processing tub 72 for rinsing, and substrate elevating devices 73 and 74. The processing tub 71 for cleaning stores therein a chemical liquid for cleaning (hereinafter, referred to as "chemical cleaning liquid"). The chemical cleaning liquid may be, by way of non-limiting example, SC-1 (a mixture of ammonia, hydrogen peroxide and water).

In the processing tub 72 for rinsing, a processing liquid for rinsing (for example, deionized water) is stored. Each of the substrate elevating devices 73 and 74 is configured to hold the plurality of wafers W of the single lot while allowing the wafers W to be arranged side by side in the upright posture.

The cleaning apparatus 70 holds, with the substrate elevating device 73, the lot transferred by the lot transferring unit 5, and performs the cleaning processing by immersing the lot in the cleaning liquid of the processing tub 71.

The lot after being subjected to the cleaning processing in the processing tub 71 is transferred to the processing tub 72 by the lot transferring unit 5. Then, the cleaning apparatus 70 holds the transferred lot with the substrate elevating device 74, and performs the rinsing processing by immersing the lot in the rinse liquid of the processing tub 72. The lot after being subjected to the rinsing processing in the processing tub 72 is then transferred to a processing tub 91 of the drying apparatus 90 by the lot transferring unit 5.

The drying apparatus 90 is equipped with the processing tub 91 and a substrate elevating device 92. A processing gas for drying is supplied into the processing tub 91. The substrate elevating device 92 holds the plurality of wafers W belonging to the single lot while allowing the wafers to be arranged side by side in the upright posture.

The drying apparatus 90 holds, with the substrate elevating device 92, the lot transferred by the lot transferring unit 5, and performs the drying processing by using the processing gas for drying supplied into the processing tub 91. The lot after being subjected to the drying processing in the processing tub 91 is transferred to the lot placing unit 4 by the lot transferring unit 5.

The cleaning apparatus 80 performs a cleaning processing upon the substrate holding body 53 of the lot transfer device 50 by supplying a processing liquid for cleaning and a drying gas to the substrate holding body 53.

The controller 7 controls operations of the individual components (the carrier carry-in/out unit 2, the lot forming unit 3, the lot placing unit 4, the lot transferring unit 5, the lot processing unit 6, etc.) of the substrate processing system 1. The controller 7 controls the operations of the individual components of the substrate processing system 1 based on signals from a switch, various kinds of sensors, or the like.

The controller 7 includes a microcomputer having a CPU (Central Processing Unit), a ROM (Read Only Memory), a RAM (Random Access Memory), an input/output port, and so forth; and various kinds of circuits. The controller 7 controls the operation of the substrate processing system 1 by reading and executing a program stored in a non-illustrated storage.

The controller 7 includes a computer-readable recording medium 8. The recording medium 8 stores therein the program for controlling various processings performed in the substrate processing system 1. This program may be recorded on the computer-readable recording medium 8, and may be installed from another recording medium to the recording medium 8 of the controller 7.

The computer-readable recording medium 8 may be, by way of non-limiting example, a hard disk (HD), a flexible disk (FD), a compact disk (CD), a magnet optical disk (MO), a memory card, or the like.

<Configuration of Etching Apparatus>

Figure 2:
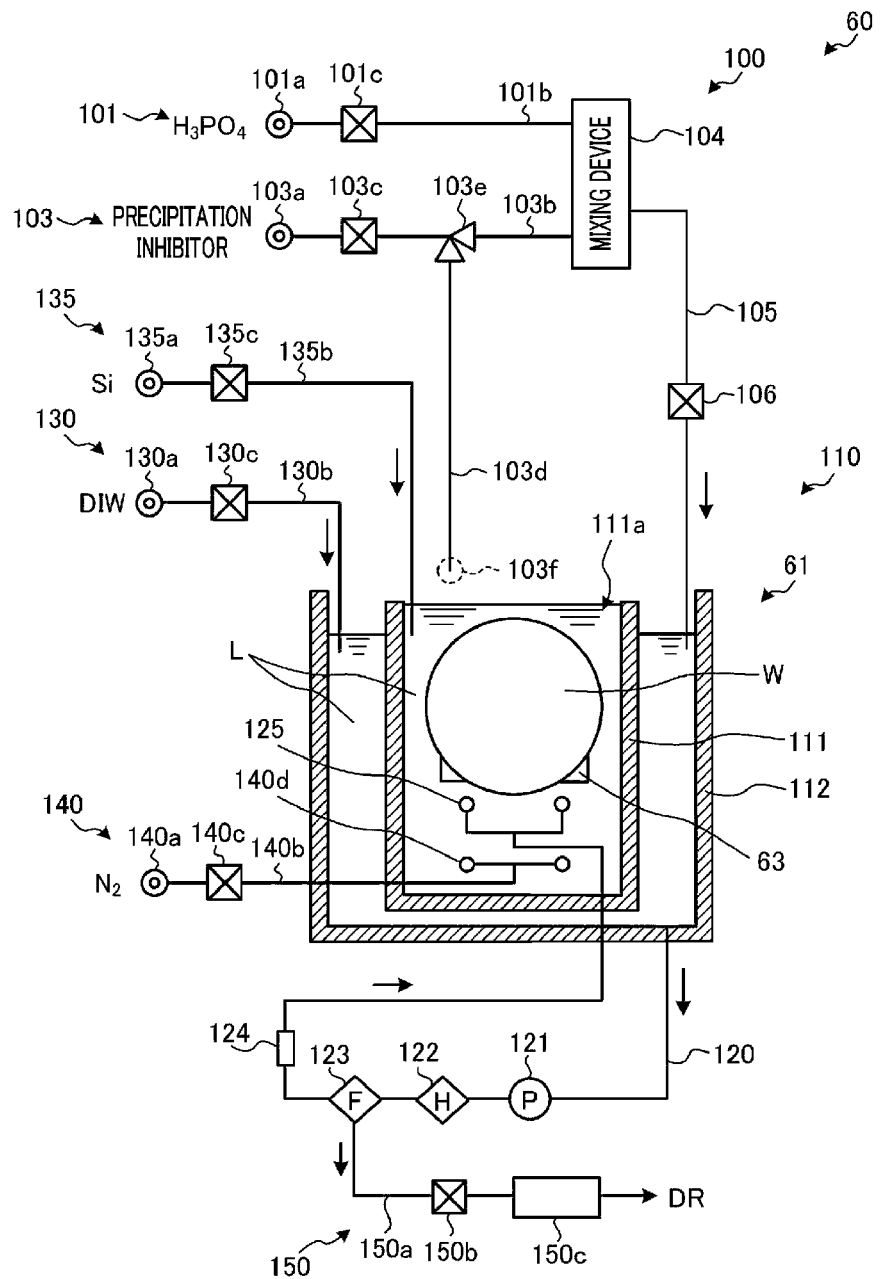
FIG. 2 is a schematic diagram illustrating a configuration of an etching apparatus according to the exemplary embodiment.

Now, a configuration of the etching apparatus 60 configured to perform the etching processing of the wafer W will be explained with reference to FIG. 2. FIG. 2 is a schematic diagram illustrating the configuration of the etching apparatus 60 according to the exemplary embodiment.

The etching apparatus 60 includes a phosphoric acid processing liquid supply 100 and a substrate processing unit 110. The phosphoric acid processing liquid supply 100 prepares a phosphoric acid processing liquid L and supplies it to the substrate processing unit 110.

The phosphoric acid processing liquid supply 100 includes a phosphoric acid aqueous solution supply 101, a precipitation inhibitor supply 103, a mixing device 104, a phosphoric acid processing liquid supply path 105, and a flow rate controller 106.

The phosphoric acid aqueous solution supply 101 is configured to supply a phosphoric acid aqueous solution to the mixing device 104. This phosphoric acid aqueous solution supply 101 has a phosphoric acid aqueous solution source 101a, a phosphoric acid aqueous solution supply path 101b, and a flow rate controller 101c.

The phosphoric acid aqueous solution source 101a is, for example, a tank that stores the phosphoric acid aqueous solution therein. The phosphoric acid aqueous solution supply path 101b connects the phosphoric acid aqueous solution source 101a and the mixing device 104 to supply the phosphoric acid aqueous solution from the phosphoric acid aqueous solution source 101a to the mixing device 104.

The flow rate controller 101c is disposed in the phosphoric acid aqueous solution supply path 101b to adjust a flow rate of the phosphoric acid aqueous solution to be supplied to the mixing device 104. The flow rate controller 101c has an opening/closing valve, a flow rate control valve, a flow meter, and the like.

The precipitation inhibitor supply 103 is configured to supply a precipitation inhibitor to the mixing device 104. This precipitation inhibitor supply 103 includes a precipitation inhibitor source 103a, a precipitation inhibitor supply path 103b, and a flow rate controller 103c.

The precipitation inhibitor source 103a is, for example, a tank that stores the precipitation inhibitor therein. The precipitation inhibitor supply path 103b connects the precipitation inhibitor source 103a and the mixing device 104 to supply the precipitation inhibitor to the mixing device 104 from the precipitation inhibitor source 103a.

The flow rate controller 103c is disposed in the precipitation inhibitor supply path 103b to adjust a flow rate of the precipitation inhibitor to be supplied to the mixing device 104. The flow rate controller 103c has an opening/closing valve, a flow rate control valve, a flow meter, and the like.

The precipitation inhibitor according to the exemplary embodiment is not particularly limited as long as it contains a component that suppresses precipitation of silicon oxide. The precipitation inhibitor may contain, for example, a component that suppresses precipitation of silicon oxide by stabilizing silicon ions dissolved in the phosphoric acid aqueous solution in the dissolved state. Further, the precipitation inhibitor may contain a component that suppresses precipitation of silicon oxide by any of various commonly known methods.

As an example of the precipitation inhibitor according to the exemplary embodiment, a hexafluorosilicic acid ($H_2SiF_6$) aqueous solution containing a fluorine component may be used. Furthermore, in order to stabilize hexafluorosilicic acid in the aqueous solution, the precipitation inhibitor may further contain an additive such as ammonia.

By way of non-limiting example, ammonium hexafluorosilicate (($NH_4)_2SiF_6$) or sodium hexafluorosilicate ($Na_2SiF_6$) may be used as an example of the precipitation inhibitor according to the exemplary embodiment.

Further, the precipitation inhibitor according to the exemplary embodiment may be a compound containing an element with cations having an ionic radius of 0.2 Å to 0.9 Å. Here, the term "ionic radius" refers to a radius of an ion obtained empirically from a sum of the radii of an anion and a cation obtained from a lattice constant of a crystal lattice.

The precipitation inhibitor according to the exemplary embodiment may contain, by way of non-limiting example, an oxide of any one element selected from aluminum, potassium, lithium, sodium, magnesium, calcium, zirconium, tungsten, titanium, molybdenum, hafnium, nickel, and chromium.

Further, the precipitation inhibitor according to the exemplary embodiment may contain at least one of a nitride, a chloride, a bromide, a hydroxide and a nitrate of the aforementioned any one element instead of or in addition to this oxide of the aforementioned any one element.

The precipitation inhibitor according to the exemplary embodiment may contain, at least one of, for example, $Al(OH)_3$, $AlCl_3$, $AlBr_3$, $Al(NO_3)_3$, $Al_2(SO_4)_3$, $AlPO_4$, and $Al_2O_3$.

Further, the precipitation inhibitor according to the exemplary embodiment may contain at least one of KCl, KBr, KOH, and $KNO_3$. Furthermore, the precipitation inhibitor according to the exemplary embodiment may contain at least one of LiCl, NaCl, $MgCl_2$, $CaCl_2$, and $ZrCl_4$.

In addition, the precipitation inhibitor supply 103 according to the exemplary embodiment is configured to supply the precipitation inhibitor to the processing tub 61 as well.

Specifically, the precipitation inhibitor supply 103 is further equipped with a processing tub supply path 103d and a switching valve 103e.

The processing tub supply path 103d is a flow path branched from the precipitation inhibitor supply path 103b. A discharge portion 103f corresponding to a leading end of the processing tub supply path 103d is located above an inner tub 111 in the processing tub 61. Specifically, the discharge portion 103f is located at a position higher than a liquid surface of the phosphoric acid processing liquid L stored in the inner tub 111. The switching valve 103e is provided at a branch point between the precipitation inhibitor supply path 103b and the processing tub supply path 103d, and serves to switch a flow destination of the precipitation inhibitor between the mixing device 104 and the processing tub 61.

As described above, the precipitation inhibitor supply 103 is capable of supplying the precipitation inhibitor stored in the precipitation inhibitor source 103a to the inner tub 111 via the processing tub supply path 103d.

The mixing device 104 is configured to mix the phosphoric acid aqueous solution and the precipitation inhibitor to produce the phosphoric acid processing liquid L. That is, the phosphoric acid processing liquid L according to the exemplary embodiment contains the phosphoric acid aqueous solution and the precipitation inhibitor at least. Further, as will be described later, the phosphoric acid processing liquid L may further contain a silicon solution.

As an example, the mixing device 104 has a tank and a circulation path. The circulation path is provided with a pump, a filter, a heater, and so forth. The mixing device 104 is capable of mixing a liquid stored in the tank by circulating this liquid through the circulation path. Further, the mixing device 104 is capable of heating the liquid to a required temperature by using the heater provided in the circulation path.

Moreover, the precipitation inhibitor according to the exemplary embodiment contains alcohol as a solvent. The alcohol contained as the solvent is, for example, any one of methanol, ethanol, propyl alcohol, and isopropyl alcohol. In this way, the phosphoric acid processing liquid L according to the exemplary embodiment contains the phosphoric acid aqueous solution and the aforementioned alcohol.

The phosphoric acid processing liquid supply path 105 connects the mixing device 104 and an outer tub 112 of the processing tub 61 to supply the phosphoric acid processing liquid L from the mixing device 104 to the outer tub 112.

The flow rate controller 106 is disposed in the phosphoric acid processing liquid supply path 105 to adjust a flow rate of the phosphoric acid processing liquid L to be supplied to the outer tub 112. The flow rate controller 106 includes an opening/closing valve, a flow rate control valve, a flow meter, and the like.

The substrate processing unit 110 immerses the wafer W in the phosphoric acid processing liquid L supplied from the phosphoric acid processing liquid supply 100 to perform an etching processing on the wafer W. The wafer W is an example of a substrate. For example, between a silicon nitride film and a silicon oxide film formed on the wafer W, the silicon nitride film may be selectively etched in the present exemplary embodiment.

The substrate processing unit 110 is equipped with the processing tub 61, the substrate elevating device 63, a circulation path 120, a DIW supply 130, a silicon solution supply 135, a gas supply 140, and a processing liquid drain unit 150. The processing tub 61 includes the inner tub 111, the outer tub 112, and a cover body (not shown).

The inner tub 111 is a tub for immersing the wafer W in the phosphoric acid processing liquid L, and stores therein the phosphoric acid processing liquid L for immersion. The inner tub 111 has a top opening 111a, and the phosphoric acid processing liquid L is stored up to near the opening 111a of the inner tub 111.

In the inner tub 111, a plurality of wafers W are immersed in the phosphoric acid processing liquid L by using the substrate elevating device 63, and the etching processing is performed on the wafers W. This substrate elevating device 63 is configured to be movable up and down, and holds the plurality of wafers W while allowing the wafers W to be arranged side by side in a vertical posture.

The outer tub 112 is disposed outside the inner tub 111 so as to surround the inner tub 111, and receives the phosphoric acid processing liquid L flown out from the opening 111a of the inner tub 111. As shown in FIG. 2, a liquid level of the outer tub 112 is maintained lower than the liquid level of the inner tub 111.

In addition, the outer tub 112 has a non-illustrated temperature sensor. The temperature sensor is configured to detect a temperature of the phosphoric acid processing liquid L. A signal generated by the temperature sensor of the outer tub 112 is transmitted to the aforementioned controller 7.

The inner tub 111, the outer tub 112, and the cover body are made of, for example, a material such as quartz having high heat resistance and high chemical resistance. Accordingly, the controller 7 is capable of etching the wafers W efficiently because it can etch the wafers W with the phosphoric acid processing liquid L maintained at a high temperature (for example, 150° C. or higher).

The outer tub 112 and the inner tub 111 are connected by the circulation path 120. One end of the circulation path 120 is connected to a bottom of the outer tub 112, and the other end of the circulation path 120 is connected to a processing liquid supply nozzle 125 located in the inner tub 111.

In the circulation path 120, a pump 121, a heater 122, a filter 123, and a silicon concentration meter 124 are provided in sequence from the outer tub 112 side.

The pump 121 is configured to form a circulating flow of the phosphoric acid processing liquid L sent from the outer tub 112 to the inner tub 111 via the circulation path 120. Moreover, the phosphoric acid processing liquid L overflows from the opening 111a of the inner tub 111, and is flown back into the outer tub 112. In this way, the circulating flow of the phosphoric acid processing liquid L is formed in the substrate processing unit 110. That is, this circulating flow is formed in the outer tub 112, the circulation path 120 and the inner tub 111.

The heater 122 is configured to adjust the temperature of the phosphoric acid processing liquid L circulating in the circulation path 120. The filter 123 is configured to filter the phosphoric acid processing liquid L circulating in the circulation path 120. The silicon concentration meter 124 is configured to detect a silicon concentration of the phosphoric acid processing liquid L circulating in the circulation path 120. A signal generated by the silicon concentration meter 124 is sent to the controller 7.

The DIW supply 130 has a DIW source 130a, a DIW supply path 130b, and a flow rate controller 130c. The DIW supply 130 is configured to supply DIW (DeIonized Water) into the outer tub 112 to adjust a concentration of the phosphoric acid processing liquid L stored in the processing tub 61.

The DIW supply path 130b connects the DIW source 130a and the outer tub 112 to supply the DIW of a predetermined temperature from the DIW source 130a into the outer tub 112.

The flow rate controller 130c is disposed in the DIW supply path 130b to adjust a supply amount of the DIW into the outer tub 112. The flow rate controller 130c includes an opening/closing valve, a flow rate control valve, a flow meter, and the like. As the supply amount of the DIW is adjusted by the flow rate controller 130c, the temperature, the phosphoric acid concentration, the silicon concentration, and the precipitation inhibitor concentration of the phosphoric acid processing liquid L in the etching apparatus 60 are adjusted.

The silicon solution supply 135 is configured to supply the silicon solution to the processing tub 61. This silicon solution supply 135 has a silicon solution source 135a, a silicon solution supply path 135b, and a flow rate controller 135c.

The silicon solution source 135a is, for example, a tank that stores the silicon solution therein. The silicon solution supply path 135b connects the silicon solution source 135a and the inner tub 111 to supply the silicon solution from the silicon solution source 135a to the inner tub 111.

The flow rate controller 135c is disposed in the silicon solution supply path 135b to adjust a flow rate of the silicon solution supplied to the inner tub 111. The flow rate controller 135c has an opening/closing valve, a flow rate control valve, a flow meter, and the like. The silicon solution according to the exemplary embodiment is, by way of non-limiting example, a solution in which colloidal silicon is dispersed.

The gas supply 140 is configured to discharge bubbles of an inert gas (e.g., a nitrogen gas) into the phosphoric acid processing liquid L stored in the inner tub 111. The gas supply 140 includes an inert gas source 140a, an inert gas supply path 140b, a flow rate controller 140c, and a gas nozzle 140d.

The inert gas supply path 140b connects the inert gas source 140a and the gas nozzle 140d to supply the inert gas (e.g., the nitrogen gas) from the inert gas source 140a to the gas nozzle 140d.

The flow rate controller 140c is disposed in the inert gas supply path 140b to adjust a supply amount of the inert gas into the gas nozzle 140d. The flow rate controller 140c has an opening/closing valve, a flow rate control valve, a flow meter, and the like.

The gas nozzle 140d is positioned below the wafer W and the processing liquid supply nozzle 125 in the inner tub 111, for example. The gas nozzle 140d is configured to discharge the bubbles of the inert gas into the phosphoric acid processing liquid L stored in the inner tub 111.

In the etching apparatus 60 according to the exemplary embodiment, by discharging the bubbles of the inert gas from the gas nozzle 140d, it is possible to supply the phosphoric acid processing liquid L into gaps between the plurality of wafers W arranged in the inner tub 111 at a high flow velocity. Therefore, according to the exemplary embodiment, the plurality of wafers W can be etched efficiently and uniformly.

The processing liquid drain unit 150 is configured to drain the phosphoric acid processing liquid L into a drain DR when replacing the used phosphoric acid processing liquid L with a new one, for example. The processing liquid drain unit 150 includes a drain path 150a, a flow rate controller 150b, and a cooling tank 150c.

The drain path 150a is connected to the circulation path 120. The flow rate controller 150b is disposed in the drain path 150a to adjust a draining amount of the phosphoric acid processing liquid L. The flow rate controller 150b has an opening/closing valve, a flow rate control valve, a flow meter, and the like.

The cooling tank 150c temporarily stores to cool the phosphoric acid processing liquid L flown through the drain path 150a. In the cooling tank 150c, the draining amount of the phosphoric acid processing liquid L is adjusted by the flow rate controller 150b.

Here, as described above, the precipitation inhibitor supply 103 according to the exemplary embodiment supplies the precipitation inhibitor into the inner tub 111. The precipitation inhibitor supplied into the inner tub 111 is overflown from the inner tub 111 to be moved into the outer tub 112, and is returned from the outer tub 112 back into the inner tub 111 through the circulation path 120. By this cycle, the substrate processing system 1 is capable of mixing the additionally added precipitation inhibitor with the phosphoric acid processing liquid L. Within the inner tub 111, the liquid flow of the phosphoric acid processing liquid L is formed by the gas discharged from the gas supply 140. By using this liquid flow, the additionally added precipitation inhibitor and the phosphoric acid processing liquid L can be mixed more rapidly.

Moreover, the precipitation inhibitor supply 103 supplies the precipitation inhibitor onto the liquid surface of the phosphoric acid processing liquid L in the inner tub 111 from the discharge portion 103f of the processing tub supply path 103d by dripping.

The alcohol contained as the solvent in the precipitation inhibitor has a boiling point lower than that of phosphoric acid. For this reason, if the precipitation inhibitor is simply supplied into the phosphoric acid processing liquid L of a high temperature, the alcohol in the precipitation inhibitor may boil in the phosphoric acid processing liquid L of the high temperature, and a large amount of bubbles may be generated in the phosphoric acid processing liquid L. Moreover, there is a risk that the phosphoric acid processing liquid L containing the large amount of bubbles may be overflown from the processing tub 61, so that the liquid amount in the processing tub 61 may be reduced significantly, which makes it difficult to perform the etching processing stably.

As a resolution, by supplying the precipitation inhibitor into the phosphoric acid processing liquid L in a small amount by dripping, bumping of the precipitation inhibitor can be suppressed.

<Selectivity Adjustment Mechanism by Precipitation Inhibitor>

Figure 3:
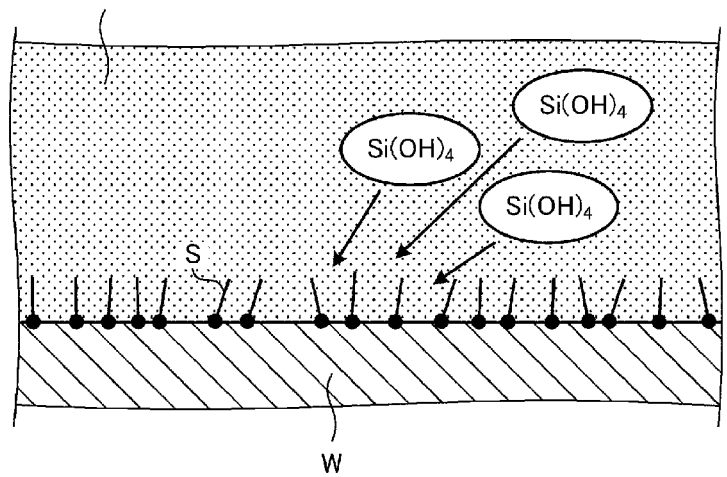
FIG. 3 is an explanatory diagram for describing a mechanism of precipitation inhibition of silicon oxide by a precipitation inhibitor.
Figure 4:
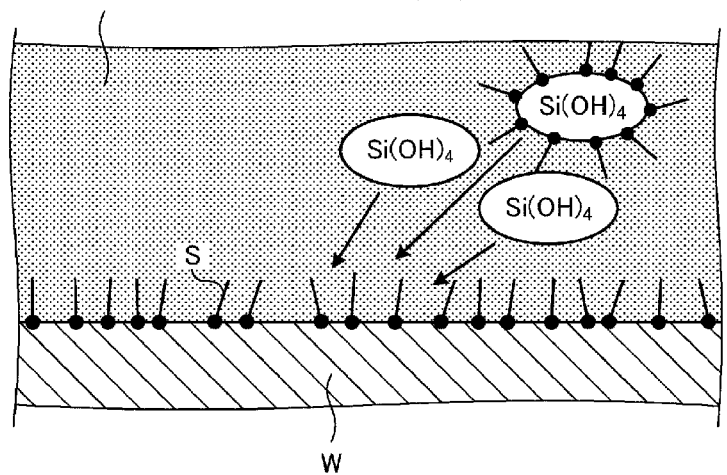
FIG. 4 is an explanatory diagram for describing a selectivity adjustment mechanism by the precipitation inhibitor.

As stated above, the inventor of the present application has discovered that selectivity of the silicon nitride film with respect to the silicon oxide film can be adjusted. This mechanism will be described with reference to FIG. 3 and FIG. 4. FIG. 3 is an explanatory diagram for describing a mechanism of precipitation inhibition of silicon oxide by the precipitation inhibitor. FIG. 4 is an explanatory diagram for describing a selectivity adjustment mechanism by the precipitation inhibitor.

During the etching processing, the following reaction takes place in the processing tub 61.

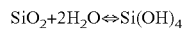

The precipitation of the silicon oxide occurs when $Si(OH)_4$ in the phosphoric acid processing liquid L comes into contact with the silicon oxide film.

Meanwhile, as shown in FIG. 3, a component S (silane coupling agent) contained in the precipitation inhibitor combines with the silicon oxide film on the wafer W. Accordingly, a surface of the silicon oxide film is coated with the component S, making it difficult for $Si(OH)_4$ in the phosphoric acid processing liquid L to come into contact with the silicon oxide film. As a result, the precipitation of the silicon oxide is suppressed.

In FIG. 3, it is assumed that the concentration of the precipitation inhibitor in the phosphoric acid processing liquid L is C1. Meanwhile, FIG. 4 illustrates a state in which the concentration of the precipitation inhibitor in the phosphoric acid processing liquid L is raised from C1 to C2. As shown in FIG. 4, if the concentration of the precipitation inhibitor is increased, the component S of the precipitation inhibitor may be combined with $Si(OH)_4$ in the phosphoric acid processing liquid L as well as being combined with the silicon oxide film on the wafer W. As a result, the active $Si(OH)_4$ decreases, so that a reaction proceeding to the right in the above-specified reaction formula, that is, a reaction of $SiO_2+2H_2O \rightarrow Si(OH)_4$ proceeds easily. That is, the etching rate of the silicon oxide film is increased. Thus, by controlling the concentration of the precipitation inhibitor, it is possible to adjust the selectivity of the silicon nitride film with respect to the silicon oxide film.

<Specific Operation of Substrate Processing System 1>

Figure 5:
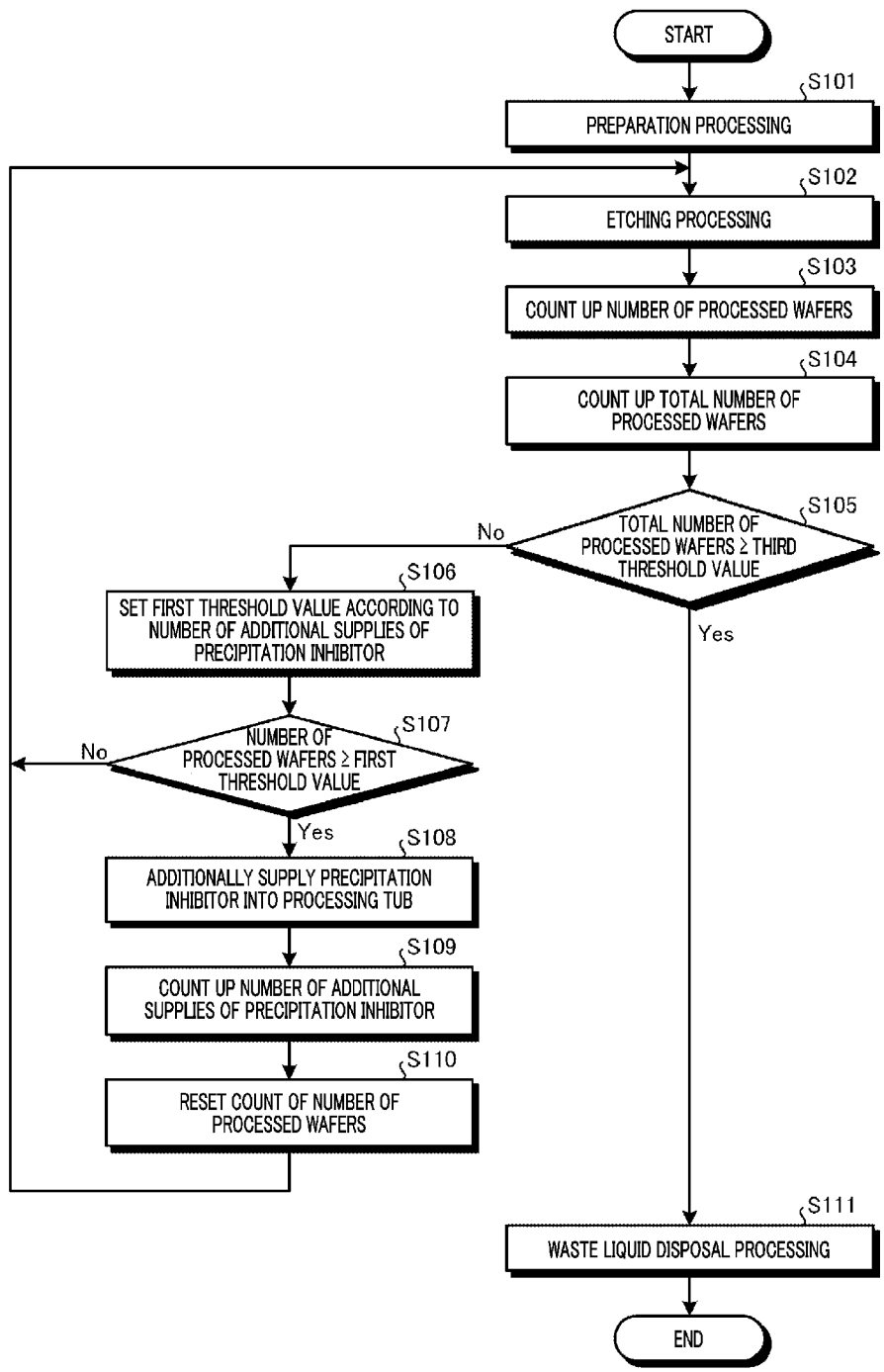
FIG. 5 is a flowchart illustrating a sequence of a series of processes of a substrate processing performed by the substrate processing system according to the exemplary embodiment.

Now, a specific operation of the substrate processing system 1 will be described with reference to FIG. 5. FIG. 5 is a flowchart illustrating a sequence of a series of processes of a substrate processing performed by the substrate processing system 1 according to the exemplary embodiment. Further, the individual processes shown in FIG. 5 are performed under the control of the controller 7. Further, FIG. 5 mainly shows a sequence of a processing in the etching apparatus 60 while omitting processings in other apparatuses such as the cleaning apparatus 70.

As depicted in FIG. 5, in the substrate processing system 1, a preparation processing is first performed (process S101). In the preparation processing, the phosphoric acid processing liquid L is prepared by using the phosphoric acid processing liquid supply 100, and the prepared phosphoric acid processing liquid L is supplied into the processing tub 61.

Specifically, by first operating the phosphoric acid aqueous solution supply 101, the phosphoric acid aqueous solution is supplied from the phosphoric acid aqueous solution source 101a into the tank of the mixing device 104. Next, while circulating the phosphoric acid aqueous solution through the circulation path of the mixing device 104, the phosphoric acid aqueous solution is heated to a required temperature by using the heater provided in the circulation path. Accordingly, the phosphoric acid aqueous solution is concentrated.

Further, in parallel with the concentration of the phosphoric acid aqueous solution, the precipitation inhibitor supply 103 is operated to supply a predetermined amount of the precipitation inhibitor into the tank of the mixing device 104 from the precipitation inhibitor source 103a. The precipitation inhibitor supplied into the tank of the mixing device 104 is mixed with the phosphoric acid aqueous solution by being circulated through the circulation path along with the phosphoric acid aqueous solution. Accordingly, the phosphoric acid processing liquid L is produced in the tank of the mixing device 104.

Next, the opening/closing valve of the flow rate controller 106 is opened, and the phosphoric acid processing liquid L stored in the tank is supplied into the processing tub 61. The phosphoric acid processing liquid L supplied to the processing tub 61 is regulated to a required temperature by the heater 122 while being circulated through the circulation path 120. Then, the silicon solution supply 135 is operated to supply the silicon solution from the silicon solution source 135a into the processing tub 61. Further, by operating the gas supply 140, the inert gas is supplied into the inner tub 111. Accordingly, the liquid flow of the phosphoric acid processing liquid L by the inert gas is formed.

Subsequently, in the substrate processing system 1, an etching processing is performed (process S102). Specifically, the lot formed of the plurality (for example, 50 sheets) of wafers W is first held by the substrate elevating device 63, and then placed in the inner tub 111 as the substrate elevating device 63 is lowered. Accordingly, the plurality of wafers W are immersed in the phosphoric acid processing liquid L of the processing tub 61. Then, the state in which the plurality of wafers W are being immersed in the phosphoric acid processing liquid L of the processing tub 61 is maintained for a predetermined time (e.g., about 1 hour to 3 hours). Thereafter, by moving up the substrate elevating device 63, the plurality of wafers W are raised from the inner tub 111.

The plurality of wafers W raised from the inner tub 111 are transferred into the processing tub 62 by the lot transfer unit 5. Then, the etching apparatus 60 holds the transferred lot with the substrate elevating device 64 and immerses the lot in the rinse liquid of the processing tub 62 to thereby perform a rinsing processing. The lot rinsed in the processing tub 62 is then transferred to the processing tub 71 of the cleaning apparatus 70 by the lot transferring unit 5.

Subsequently, the controller 7 counts up the number of the processed wafers (process S103), and counts up the total number of the processed wafers (process S104).

Here, the number of the processed wafers W is the number of the wafers W etched in the process S102 until the precipitation inhibitor is additionally supplied in a process S108 to be described later. Specifically, when the etching processing of the process S102 is an etching processing performed for the first time (hereinafter, also referred to as "first etching processing") after the preparation processing of the process S101, the number of the processed wafers W is equivalent to the number of the wafers W processed until the precipitation inhibitor is additionally supplied, starting from the first etching processing. Further, when the etching processing of the process S102 is an etching processing performed for the second time or thereafter, the number of the processed wafers is equivalent to the number of the wafers processed after the precipitation inhibitor is additionally supplied in the process S108 until the precipitation inhibitor is additionally supplied in the next process S108.

Further, the total number of the processed wafers W is the number of the wafers W etched in the process S102 during a period after the preparation processing of the process S101 is performed until a waste liquid disposal processing of a process S111 to be described later is performed. That is, the total number of the processed wafers is the sum of the wafers processed from the first etching processing.

For example, when the single lot is formed of 50 sheets of wafers, the controller 7 counts up the number of the processed wafers by 50 in the process S103, and counts up the total number of the processed wafers by 50 in the process S104.

Subsequently, the controller 7 makes a determination upon whether the total number of the processed wafers is equal to or larger than a third threshold value, that is, whether the total number of the processed wafers has reached the third threshold value (process S105). In this process, when the total number of the processed wafers has not reached the third threshold value (process S105, No), the controller 7 sets a first threshold value according to the number of additional supplies of the precipitation inhibitor (process S106). This will be described with reference to FIG. 6. FIG. 6 is a diagram illustrating an example of first threshold information. The first threshold information is stored in a non-illustrated storage belonging to the substrate processing system 1.

As shown in FIG. 6, the first threshold information is information in which the number of the additional supplies of the precipitation inhibitor is matched with the first threshold value. In the example shown in FIG. 6, the first threshold value of '50 sheets' is matched with the number of the additional supplies of the precipitation inhibitor of '0'; the first threshold value of '60 sheets' is matched with the number of the additional supplies of the precipitation inhibitor of '1'; and the first threshold value of '70 sheets' is matched with the number of the additional supplies of the precipitation inhibitor of '2'. In this case, the controller 7 sets '50 sheets' as the first threshold value when the number of the additional supplies of the precipitation inhibitor is '0'. Likewise, the controller 7 sets '60 sheets' as the first threshold value when the number of the additional supplies of the precipitation inhibitor is '1', and sets '70 sheets' as the first threshold value when the number of the additional supplies of the precipitation inhibitor is '2'.

In this way, in the substrate processing system 1 according to the exemplary embodiment, whenever the number of the additional supplies of the precipitation inhibitor increases, the first threshold value is set to be higher. Whenever the precipitation inhibitor is additionally supplied, the concentration of the precipitation inhibitor in the phosphoric acid processing liquid L increases. A characteristic of the phosphoric acid processing liquid L varies depending on the concentration of the precipitation inhibitor. Specifically, as the concentration of the precipitation inhibitor in the phosphoric acid processing liquid L increases, the decrease in the etching rate of the silicon oxide film with respect to the number of the processed wafers W becomes gentle. That is, the higher the concentration of the precipitation inhibitor in the phosphoric acid processing liquid L is, the higher an upper limit of the number of processed wafers W capable of allowing the selectivity to fall within a tolerance range is. Thus, by setting the first threshold value to be higher with the increase of the number of the additional supplies of the precipitation inhibitor, the selectivity of the silicon nitride film with respect to the silicon oxide film can be appropriately managed even when the precipitation inhibitor is additionally supplied.

Reference is made back to FIG. 5. In a process S107, the controller 7 makes a determination upon whether the number of the processed wafers is equal to or larger than the first threshold value, that is, whether the number of the processed wafers has reached the first threshold value. In this process, if the number of the processed wafers has not reached the first threshold value (process S107, No), the controller 7 returns the processing back to the process S102.

Meanwhile, if it is determined in the process S107 that the number of the processed wafers has reached the first threshold value (process S107, Yes), the controller 7 additionally supplies the precipitation inhibitor into the processing tub 61 (process S108). Specifically, the controller 7 operates the precipitation inhibitor supply 103 to supply the precipitation inhibitor to the inner tub 111 from the precipitation inhibitor source 103a. As described above, the precipitation inhibitor is supplied by dripping from a position higher than the liquid surface of the phosphoric acid processing liquid L stored in the inner tub 111 onto the liquid surface of the phosphoric acid processing liquid L. Accordingly, it is possible to additionally supply the precipitation inhibitor to the phosphoric acid processing liquid L while suppressing the bumping of the precipitation inhibitor.

In addition, the amount of the precipitation inhibitor additionally supplied in the process S108 may be a fixed amount each time. Here, this "fixed amount" may be equal to, for example, the amount of the precipitation inhibitor mixed into the phosphoric acid aqueous solution in the preparation processing of the process S101.

Next, the controller 7 counts up the number of the additional supplies of the precipitation inhibitor (process S109). Accordingly, in a next determination processing of the process S107, a first threshold value higher than the currently used first threshold value is used. Further, the controller 7 resets a count of the number of the processed wafers (process S110). Thereafter, the controller 7 returns the processing back to the process S102.

As described above, in the substrate processing system 1 according to the exemplary embodiment, the process of additionally supplying the precipitation inhibitor is performed until the next etching processing is begun after the current etching processing is ended. Accordingly, as compared to, for example, a case where the precipitation inhibitor is additionally supplied in the middle of the etching processing, influence (for example, a change in selectivity, etc.) caused by the additional supply of the precipitation inhibitor can be suppressed from occurring during the etching processing. Therefore, each etching processing can be performed stably.

Meanwhile, if it is determined in the process S105 that the total number of the processed wafers has reached the third threshold value (process S105, Yes), the controller 7 performs the waste liquid disposal processing (process S111). Specifically, the controller 7 operates the processing liquid drain unit 150 to drain all of the phosphoric acid processing liquid L from the processing tub 61. Thereafter, the controller 7 resets the counts of the number of the processed wafers, the total number of the processed wafers, and the number of the additional supplies of the precipitation inhibitor to end the series of processes. Here, the third threshold value is a value larger than the first threshold value.

As described above, in the substrate processing system 1 according to the exemplary embodiment, by appropriately adding the precipitation inhibitor into the processing tub 61, it is possible to reuse the phosphoric acid processing liquid L prepared in the process S101 in the multiple etching processes. Thus, in the substrate processing system 1 according to the exemplary embodiment, the efficiency of using the phosphoric acid aqueous solution can be improved.

MODIFICATION EXAMPLE

Figure 7:
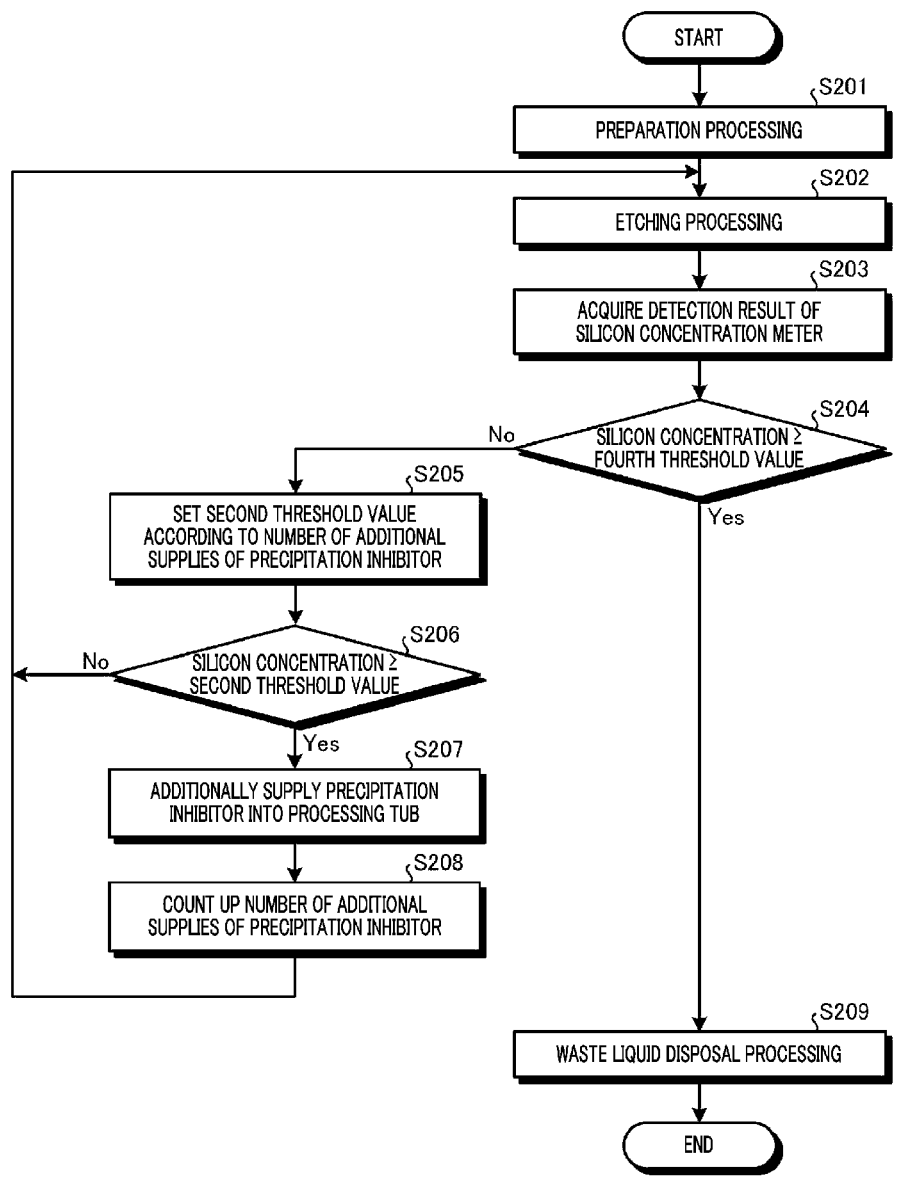
FIG. 7 is a flowchart illustrating a sequence of processes of a substrate processing performed by the substrate processing system according to a modification example.

The above exemplary embodiment has been described for the example where the timing for additionally supplying the precipitation inhibitor is determined based on the number of the wafers W processed. However, without being limited thereto, the controller 7 may decide the timing for additionally supplying the precipitation inhibitor based on the silicon concentration in the phosphoric acid processing liquid L. This example case will be described with reference to FIG. 7. FIG. 7 is a flowchart illustrating a sequence of a series of processes of a substrate processing performed by the substrate processing system 1 according to a modification example.

As shown in FIG. 7, in the substrate processing system 1, after a preparation processing is performed (process S201), an etching processing is performed (process S202). Since the preparation processing of the process S201 and the etching processing of the process S202 are the same as the processes S101 and S102 shown in FIG. 5, description thereof will be omitted here.

Upon the completion of the etching processing, the controller 7 acquires a detection result of the silicon concentration meter 124 (process S203). Then, the controller 7 makes a determination upon whether the silicon concentration in the phosphoric acid processing liquid L is equal to or larger than a fourth threshold value, that is, whether the silicon concentration in the phosphoric acid processing liquid L has reached the fourth threshold value (process S204). In this process, if the silicon concentration has not reached the fourth threshold value (process S204, No), the controller 7 sets a second threshold value according to the number of the additional supplies of the precipitation inhibitor (process S205).

In the modification example, second threshold information is stored in the non-illustrated storage of the substrate processing system 1. The second threshold information is information in which the number of the additional supply of the precipitation inhibitor and the second threshold value are matched. In the second threshold information, as the number of the additional supplies of the precipitation inhibitor increases, a higher second threshold value is matched. That is, in the substrate processing system 1 according to the modification example, the second threshold value is set to be higher whenever the number of the additional supply of the precipitation inhibitor increases.

As stated above, the higher the concentration of the precipitation inhibitor in the phosphoric acid processing liquid L, the higher the upper limit of the number of the processed wafers W capable of allowing the selectivity to fall within the tolerance range. The silicon concentration in the phosphoric acid processing liquid L increases in proportion to the number of the wafers W processed. Accordingly, by increasing the second threshold value with the increase of the number of the additional supplies of the precipitation inhibitor, the selectivity of the silicon nitride film with respect to the silicon oxide film can be appropriately managed even when the precipitation inhibitor is additionally added.

In the process S206, the controller 7 determines whether the silicon concentration is equal to or larger than the second threshold value, that is, whether the silicon concentration has reached the second threshold value. In this process, if the silicon concentration has not reached the second threshold value (process S206, No), the controller 7 returns the processing back to the process S202.

Meanwhile, if it is determined in the process S206 that the silicon concentration has reached the second threshold value (process S206, Yes), the controller 7 additionally supplies the precipitation inhibitor into the processing tub 61 (process S207).

Subsequently, the controller 7 counts up the number of the additional supplies of the precipitation inhibitor (process S208). Accordingly, in a next determination processing of the process S206, a second threshold value higher than the currently used second threshold value will be used.

Meanwhile, if it is determined in the process S204 that the silicon concentration has reached the fourth threshold value (process S204, Yes), the controller 7 performs a waste liquid disposal processing (process S209), and ends the series of processes.

Other Modification Examples

In the flowchart shown in FIG. 5, it is assumed that 'the number of the processed wafers' and 'the total number of the processed wafers' are counted, and the determination processing of the process S107 is performed based on the counting result of the 'number of processed wafers.' However, without being limited thereto, the determination processing of the process S107 may be performed based on the counting result of the 'total number of processed wafers.' In this case, the first threshold value may be set based on the total number of the processed wafers. For example, in the example shown in FIG. 6, the first threshold value of 50 sheets+60 sheets='110 sheets' may be matched with the number of the additional supply of the precipitation inhibitor of '1', and the first threshold value of 50 sheets+60 sheets+70 sheets='180 sheets' may be matched with the number of the additional supply of the precipitation inhibitor of '1.'

As described above, a substrate processing method according to the exemplary embodiment includes preparing a phosphoric acid processing liquid, etching a substrate and increasing a concentration of the precipitation inhibitor. In the preparing of the phosphoric acid processing liquid, the phosphoric acid processing liquid is prepared by supplying a precipitation inhibitor configured to inhibit precipitation of silicon oxide into a phosphoric acid aqueous solution. In the etching of the substrate, the substrate having a silicon oxide film and a silicon nitride film is etched by immersing the substrate in a processing tub in which the phosphoric acid processing liquid is stored. In the increasing of the concentration of the precipitation inhibitor, the concentration of the precipitation inhibitor in the phosphoric acid processing liquid is increased by additionally supplying the precipitation inhibitor into the phosphoric acid processing liquid in the processing tub when a number of substrates etched by the phosphoric acid processing liquid has reached a first threshold value or when a silicon concentration in the phosphoric acid processing liquid has reached a second threshold value. The etching of the substrate comprises, after the increasing of the concentration of the precipitation inhibitor, etching a new substrate by immersing the new substrate in the processing tub in which the phosphoric acid processing liquid with the increased concentration of the precipitation inhibitor is stored.

Thus, in the substrate processing method according to the exemplary embodiment, efficiency of using the phosphoric acid aqueous solution can be improved.

The substrate processing method according to the exemplary embodiment further includes draining all of the phosphoric acid processing liquid. In the draining of all of the phosphoric acid processing liquid, all of the phosphoric acid processing liquid is drained from the processing tub when the number of the substrates etched by the phosphoric acid processing liquid has reached a third threshold value higher than the first threshold value, or when the silicon concentration in the phosphoric acid processing liquid has reached a fourth threshold value higher than the second threshold value.

The increasing of the concentration of the precipitation inhibitor is performed twice or more between an end of the preparing of the phosphoric acid processing liquid and a start of the draining of all of the phosphoric acid processing liquid.

The increasing of the concentration of the precipitation inhibitor includes: additionally supplying the precipitation inhibitor; and circulating the precipitation inhibitor. In the additionally supplying of the precipitation inhibitor, the precipitation inhibitor is additionally supplied into the phosphoric acid processing liquid within the processing tub. In the circulating of the precipitation inhibitor, the precipitation inhibitor is circulated together with the phosphoric acid processing liquid through a circulation path provided in the processing tub. Thus, the additionally added precipitation inhibitor can be efficiently mixed with the phosphoric acid processing liquid.

The processing tub includes an inner tub and an outer tub. The inner tub has a top opening and is configured to store the phosphoric acid processing liquid therein. The outer tub is disposed outside the inner tub to receive the phosphoric acid processing liquid flown out from the opening. The inner tub is provided with a gas discharge unit configured to discharge a gas into the inner tub. In the additionally supplying of the precipitation inhibitor, the precipitation inhibitor is supplied into the inner tub. In the inner tub, a liquid flow of the phosphoric acid processing liquid is formed by the gas discharged from the gas discharge unit. By using this liquid flow, the additionally added precipitation inhibitor and the phosphoric acid processing liquid can be mixed more rapidly.

In the additionally supplying of the precipitation inhibitor, the precipitation inhibitor is dripped onto a liquid surface of the phosphoric acid processing liquid from a position higher than the liquid surface within the inner tub. Therefore, it is possible to suppress bumping of the precipitation inhibitor.

The increasing of the concentration of the precipitation inhibitor is performed between an end of the etching of the substrate being currently performed and a start of the etching of the substrate to be performed next. Thus, each etching process can be performed stably.

Here, it should be noted that the above-described exemplary embodiments are illustrative in all aspects and are not anyway limiting. In fact, the above-described exemplary embodiments can be embodied in various forms. Further, the above-described exemplary embodiments may be omitted, replaced and modified in various ways without departing from the scope and the spirit of claims.

According to the exemplary embodiment, it is possible to improve the efficiency of using the phosphoric acid aqueous solution.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:
1. A substrate processing method, comprising:
preparing a phosphoric acid processing liquid by supplying a precipitation inhibitor configured to inhibit precipitation of silicon oxide by being combined with a silicon oxide film of a substrate into a phosphoric acid aqueous solution;

etching the substrate having the silicon oxide film and a silicon nitride film by immersing the substrate in a processing tub in which the phosphoric acid processing liquid is stored; and increasing a concentration of the precipitation inhibitor in the phosphoric acid processing liquid by additionally supplying the precipitation inhibitor into the phosphoric acid processing liquid in the processing tub when a number of substrates etched by the phosphoric acid processing liquid has reached a first threshold value or when a silicon concentration in the phosphoric acid processing liquid has reached a second threshold value, wherein the first threshold value or the second threshold value is determined based on a number of the additional supplies of the precipitation inhibitor, and wherein the etching of the substrate comprises, after the increasing of the concentration of the precipitation inhibitor, etching a new substrate by immersing the new substrate in the processing tub in which the phosphoric acid processing liquid with the increased concentration of the precipitation inhibitor is stored.

2. The substrate processing method of claim 1, further comprising:

draining all of the phosphoric acid processing liquid from the processing tub when the number of the substrates etched by the phosphoric acid processing liquid has reached a third threshold value higher than the first threshold value, or when the silicon concentration in the phosphoric acid processing liquid has reached a fourth threshold value higher than the second threshold value.

3. The substrate processing method of claim 2, wherein the increasing of the concentration of the precipitation inhibitor is performed twice or more between an end of the preparing of the phosphoric acid processing liquid and a start of the draining of all of the phosphoric acid processing liquid.

4. The substrate processing method of claim 3, wherein the increasing of the concentration of the precipitation inhibitor comprises:

additionally supplying the precipitation inhibitor into the phosphoric acid processing liquid within the processing tub; and circulating the precipitation inhibitor together with the phosphoric acid processing liquid through a circulation path provided in the processing tub.

5. The substrate processing method of claim 3, wherein the increasing of the concentration of the precipitation inhibitor is performed between an end of the etching of the substrate being currently performed and a start of the etching of the substrate to be performed next.

6. The substrate processing method of claim 2, wherein the increasing of the concentration of the precipitation inhibitor comprises:

additionally supplying the precipitation inhibitor into the phosphoric acid processing liquid within the processing tub; and circulating the precipitation inhibitor together with the phosphoric acid processing liquid through a circulation path provided in the processing tub.

7. The substrate processing method of claim 6, wherein the processing tub comprises:

an inner tub, having a top opening, configured to store the phosphoric acid processing liquid therein; and an outer tub disposed outside the inner tub to receive the phosphoric acid processing liquid flown out from the opening, wherein the inner tub is provided with a gas discharge unit configured to discharge a gas into the inner tub, and in the additionally supplying of the precipitation inhibitor, the precipitation inhibitor is supplied into the inner tub.

8. The substrate processing method of claim 7, wherein in the additionally supplying of the precipitation inhibitor, the precipitation inhibitor is dripped onto a liquid surface of the phosphoric acid processing liquid from a position higher than the liquid surface within the inner tub.

9. The substrate processing method of claim 2, wherein the increasing of the concentration of the precipitation inhibitor is performed between an end of the etching of the substrate being currently performed and a start of the etching of the substrate to be performed next.

10. The substrate processing method of claim 1, wherein the increasing of the concentration of the precipitation inhibitor comprises:

additionally supplying the precipitation inhibitor into the phosphoric acid processing liquid within the processing tub; and circulating the precipitation inhibitor together with the phosphoric acid processing liquid through a circulation path provided in the processing tub.

11. The substrate processing method of claim 10, wherein the processing tub comprises:

an inner tub, having a top opening, configured to store the phosphoric acid processing liquid therein; and an outer tub disposed outside the inner tub to receive the phosphoric acid processing liquid flown out from the opening, wherein the inner tub is provided with a gas discharge unit configured to discharge a gas into the inner tub, and in the additionally supplying of the precipitation inhibitor, the precipitation inhibitor is supplied into the inner tub.

12. The substrate processing method of claim 11, wherein in the additionally supplying of the precipitation inhibitor, the precipitation inhibitor is dripped onto a liquid surface of the phosphoric acid processing liquid from a position higher than the liquid surface within the inner tub.

13. The substrate processing method of claim 1, wherein the increasing of the concentration of the precipitation inhibitor is performed between an end of the etching of the substrate being currently performed and a start of the etching of the substrate to be performed next.

* * * * *